INVENTOR
Gordon F. Rogers
BY
H. D. Ruston
ATTORNEY

July 13, 1954 G. F. ROGERS 2,683,841

REMOTELY CONTROLLED SOLENOID APPARATUS

Filed Sept. 15, 1951 2 Sheets-Sheet 2

INVENTOR
Gordon F. Rogers
BY H. O. Newton
ATTORNEY

Patented July 13, 1954

2,683,841

UNITED STATES PATENT OFFICE 2,683,841

REMOTELY CONTROLLED SOLENOID APPARATUS

Gordon F. Rogers, North Hollywood, Calif., assignor to Radio Corporation of America, a corporation of Delaware Application September 15, 1951, Serial No. 246,845

14 Claims. (Cl. 318—120)

Figure 1:
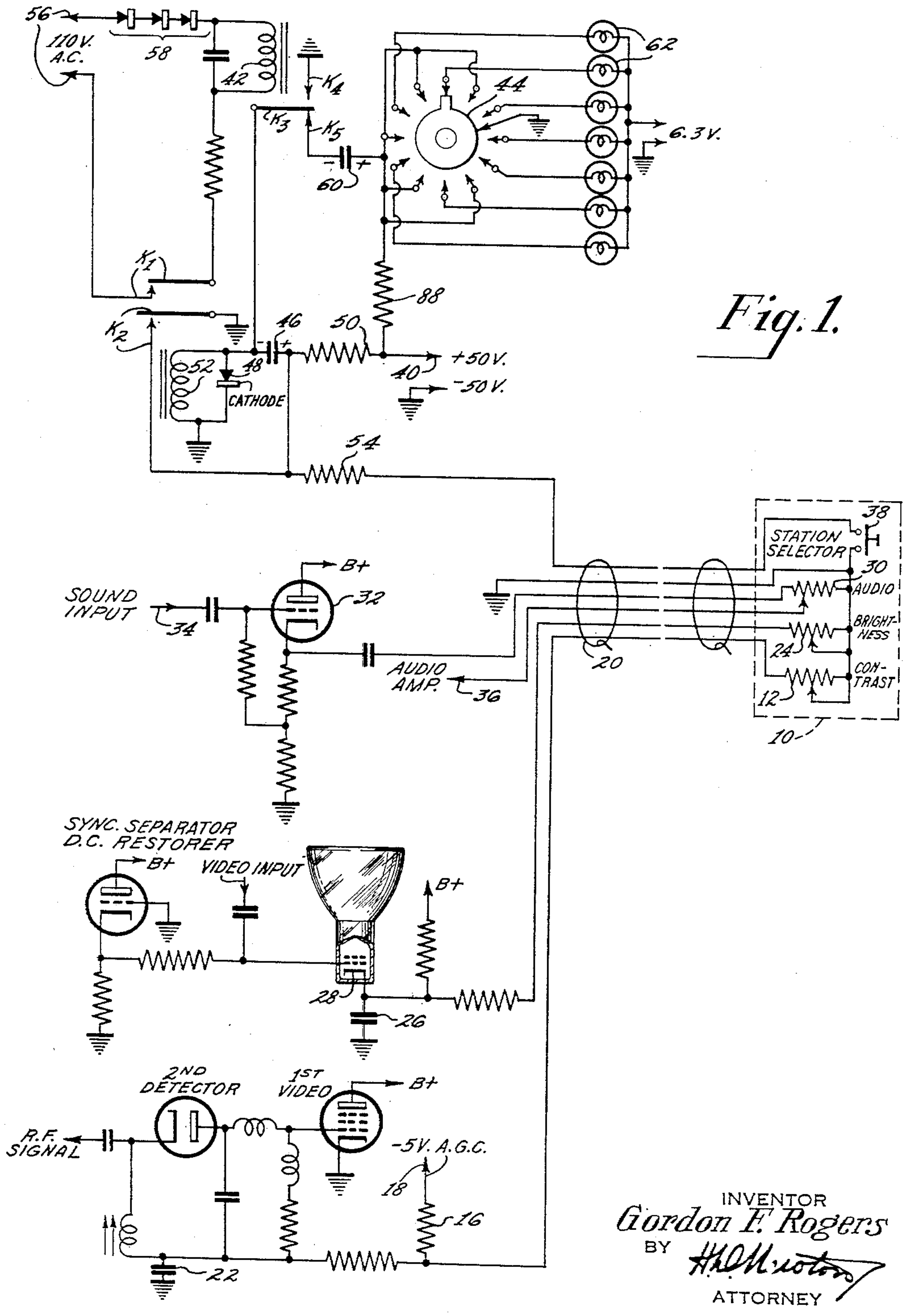

This invention relates to automatic or remote control units for automatically tuning television or radio receivers and it relates more particularly to control units including indexing systems for step-by-step actuated tuners adapted for automatic or remote tuning control.

Generally solenoid operated remote tuning means are less expensive and faster in operation than motor operated means and therefore are desirable. However conventional solenoid tuning means are inherently more noisy in operation. In accordance with the present invention therefore the noise is reduced and the solenoid efficiency is increased by utilizing substantially the entire maximum solenoid force in useful tuning operations. Thus the required actuating power is reduced by utilizing the increased force available from a solenoid near the end of its stroke to provide a detent action. The solenoid therefore does not have to overcome a detent at the start of the stroke and the required solenoid power is thus considerably reduced. Normally the inherent friction of the tuner is sufficient to maintain the position of the tuner shaft once it is stopped at the correct position.

Further increase in solenoid efficiency may be provided in accordance with the invention by removing the solenoid power before the end of the stroke so that the inertia of the solenoid and associated parts provides the final detent action. By this means the actuating energy is entirely diverted to useful tuning operation and the operating noise is minimized.

Solenoid actuated tuners therefore may be precisely and quietly controlled in accordance with the invention by providing a positive acting solenoid control circuit, for actuating an improved precision acting step-by-step tuning mechanism. In operation the tuning mechanism is actuated with a double acting stroke, wherein a cam surface rotatable with a rotatable tuner has detent notches which are successively roughly positioned by a pawl arm and precisely positioned by a roller surface throughout a single solenoid tuning stroke. Actuation of the solenoid is effected by the charge upon a capacitor in the tuning control circuit thereby improving the solenoid tuning action and preventing any misoperation due to improper operation of control switch and protection for the solenoid in the event of mechanical jamming of the solenoid.

It is therefore an object of this invention to provide an improved remote control unit for the remote control of tuning and the like, in radio and television receiving systems.

It is another object of the invention to provide a precise step-by-step automatic tuning control unit for accurately indexing sequential type rotatable television and like tuners at each one of a series of predetermined positions.

It is another object of the invention to effect efficient and quiet remote control of television receivers by solenoid actuated control means.

It is a further object of the invention to provide tuning control circuits for precisely actuatign step-by-step television remote tuners.

Figure 2:
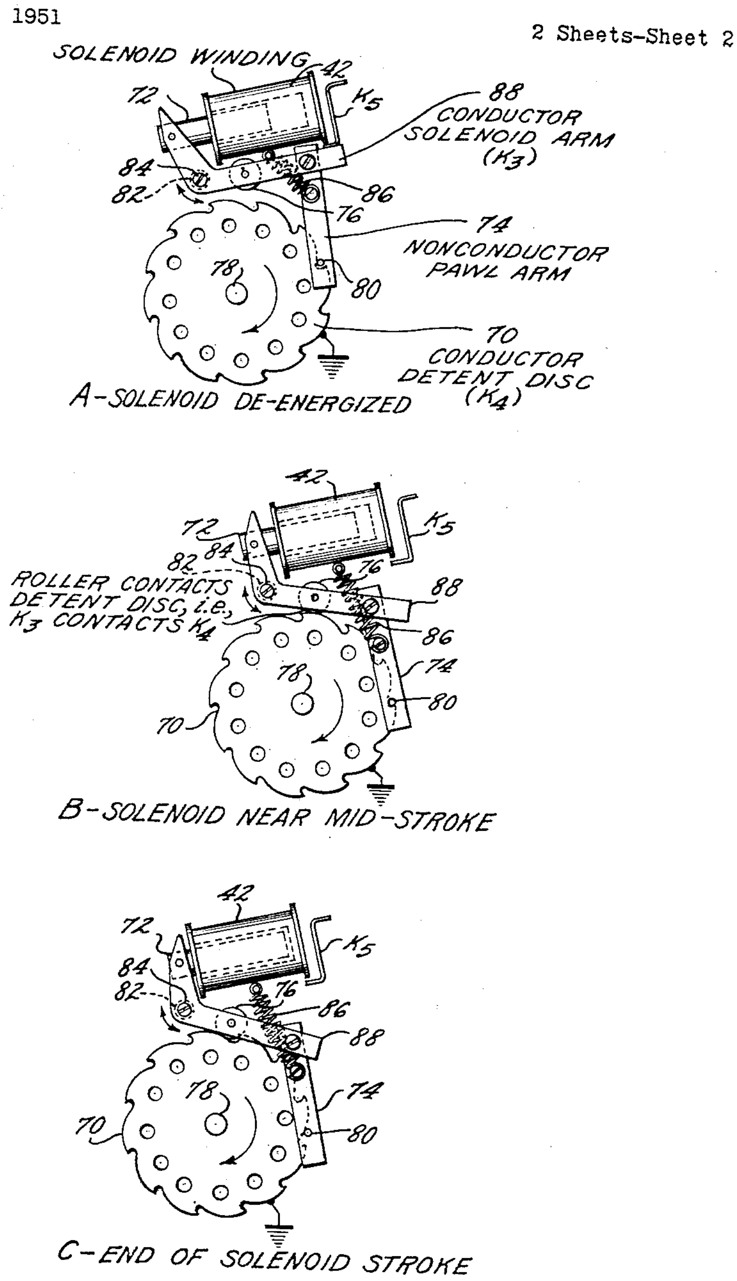

Other objects and advantages of the invention will become apparent from a reading of the following detailed description of the invention and its mode of operation together with the accompanying drawings, in which:

Figure 1 is a schematic circuit diagram of a tuning control circuit for remote control solenoid actuated mechanisms provided in accordance with the invention; and Figure 2 is an end view of a solenoid actuated indexing mechanism, constructed in accordance with the invention, in several positions encountered throughout a complete tuning stroke.

Referring now to the circuit shown in Figure 1, tuning of the television receiver is accomplished by a remote control unit 10 having separate contrast, brightness, audio and station selector controls. The contrast control rheostat 12 is connected in the grid bias circuit of the first video amplifier tube 14. Resistor 16 and the rheostat 12 are series connected between a bias source at terminal 18 and ground to vary the video amplifier tube grid bias. This bias effectively adds a direct current component to the video signal at the video amplifier tube 14 and changes the output signal of the video tube through action of the automatic gain control system which is direct current coupled to terminal 18. In this manner effectively a direct current source is used for contrast control so that there is no necessity for passing a video signal through the long cable 20 leading from the television set to the remote control unit 10. Signal ground is established for the video amplifier tube 14 by the by-pass capacitor 22 to prevent the video signals from entering the cable 20.

Likewise the brightness control is effected by a direct voltage variation by means of rheostat 24 in the kinescope cathode circuit since signals are bypassed by capacitor 26 connected from the kinescope cathode 28 to ground.

Because of the coupling circuit of the invention it is unnecessary to control the lower frequency audio signals by a direct voltage, and therefore the usual audio amplifier potentiometer gain control means 30 is connected in a signal transfer network of the audio amplifier section of the television receiver. To minimize the loss of higher audio frequencies by cable capacity, a cathode follower stage including tube 32 provides low impedance coupling from the sound input terminal 34 to the audio amplifier terminal 36. Hum is reduced by the resulting low impedance thus obtainable in the audio circuit, and the use of unshielded audio leads is thus possible.

Station selection is effected by a momentary or continuous contact of the remote control push button 38. A direct current source at terminal 40 therefore causes solenoid 42 to move from its retracted position of rest to advance a turret type station selector one or more positions as desired. Thus, in the event of an unused channel, the solenoid automatically advances the station selector shaft to the next used channel as determined by the connections of switch 44, as will hereinafter be explained in more detail. Accordingly it is only necessary to momentarily press the station selector switch 38 once to change from one station to the next.

Capacitor 46 normally is in a charged condition by conduction through diode 48, resistor 50, and the positive potential supply connected at terminal 40. Therefore operation of the station selector switch 38 in the remote control unit 10 causes current from capacitor 46 to flow through the winding of relay 52 by way of resistor 54. This resistor 54 limits the discharge rate of the capacitor 46 and reduces the surge currents to keep them from causing interference to other parts of the receiver upon actuation of the station selector switch 38. The relay 52 holds itself closed through contacts $K_2$ until the charge on capacitor 46 is dissipated in the winding of relay 52 or through the contacting of arm $K_3$ and contact $K_4$. Further, contacts $K_1$ are closed by relay 52 thus energizing the solenoid 42 from power terminals 56. In series with the relay and terminals 56 are rectifier units 58 for providing direct current operation of the solenoid 42 if desired.

As the station selector shaft rotates through each stepping position upon energization of the solenoid 42, the arm $K_3$ contacts $K_4$ near the middle of its stroke, as will be shown hereinafter in connection with Figure 2, to short circuit the relay 52 and completely discharge capacitor 46. Because a relay releases slowly when short-circuited the contacts $K_1$ (and $K_2$) do not open immediately. Thus the stroke of the solenoid is still further completed before the solenoid becomes de-energized. At the end of the solenoid stroke arm $K_3$ returns to contact $K_5$. The solenoid is then in position for another step of rotation.

If switch 44 is on a position grounding one side of capacitor 60, corresponding to a position having no local television station, the charge on capacitor 60 operates the relay and starts the cycle for a further step of rotation. When contacts $K_2$ close, capacitor 60 immediately charges capacitor 46. The charge on capacitor 46 then holds relay 52 closed after solenoid arm $K_3$ no longer contacts $K_5$. The step of rotation is then completed in the same manner hereinbefore described.

The diode 48 across the relay 52 prevents charging current for capacitor 60 or capacitor 46 from passing through and operating the relay. Charging current for capacitor 60 is provided from terminal 40 through resistor 88 (when switch 44 is in a non-grounded position) through contacts $K_5$ and $K_3$, when closed, through diode 48 to ground and minus 50 volts.

The circuit is reliable and simple to operate in that the station selector switch 38 need not be depressed for the full length of the solenoid stroke but merely long enough for the relay 52 to become actuated. Also, continued contact of switch 38 will cause no malfunction since capacitor 46 becomes completely discharged through $K_3$ and $K_4$ during the solenoid stroke. If switch 38 is then contacted or remains contacted during the strokes of the solenoid 42 caused by switch 44, capacitor 60 merely charges capacitor 46 before the relay closes contacts $K_2$.

In the event of mechanical jamming of the solenoid, preventing $K_3$ from contacting $K_4$, the voltage to solenoid 42 is soon removed due to the discharge of either capacitor 46 or 60 to prevent any damage to the system. Accordingly improved and positive indexing action is readily accomplished in accordance with the invention by a momentary contact direct current control switch at the remote unit 10.

Otherwise unused contacts on the switch 44 may be used advantageously to indicate the channel to which the receiver is tuned by means of lamps 62.

As shown in Figure 2 the indexing mechanism actuated by solenoid 42 comprises the cam surface or detent disc 70. Three positions of the tuning action are shown, i. e., A, B, C, with the solenoid de-energized, near mid-stroke and near the end of the stroke, to clearly indicate the mode of operation thereof.

The reciprocating solenoid element 72 actuates the indexing mechanism by the mechanical linkage including the pawl arm 74 and the roller surface 76, which are both adapted to contact the equidistantly spaced detent notches of the disc 70 to effect rotation of the rotatable tuner (not shown) connected to shaft 78. The linkage provides for partial rotation of the shaft 78 from one sequential tuning position to the next by the first operating mechanism through pawl pin 80 during the first portion of reciprocation of element 72. As the solenoid nears mid-stroke the roller 76 contacts the tips of the detent notches to complete the rotation by camming action upon engagement of the roller and detent camming members in the second operating mechanism. During this latter portion of the motion cycle the camming action causes shaft 78 to rotate faster than the pawl action and the pawl pin 80 is thus ineffective in causing further rotation of the shaft 78. This action is brought about by making the solenoid arm 88 and pawl arm 74 of such lengths relative to each other and to the diameter of the detent disc 70 that the two arms approach being in one straight line near the end of the solenoid stroke.

The roller 90 thereby positively detents the tuner in a precisely fixed position. Because the solenoid pull is greater near the end of its stroke the detent action is considerable and effectively advances the station selector to the proper position at each step. The solenoid winding energy is thus effectively used in attaining quiet and positive detent action in two tuning stroke steps.

The reciprocating element 72 is returned to de-energized position shown in Figure 2A by action of the pawl return spring 86. The pawl pin 80 is thus returned to engagement with the notched detent disc 70 to provide proper downward stroke during the next cycle.

To effect the switching action for automatic tuning to the next successive station, the contacts $K_3$, $K_4$ and $K_5$ may comprise portions of the indexing mechanism. Thus, $K_3$ is the conductive solenoid arm 88 which is readily used to function with the above described circuit in conjunction with the insulated or non-conductive pawl arm 74 and the detent disc 70. The detent disc 70 is therefore grounded and the roller 76 contacts the disc 70 near mid-stroke to perform the required circuit operation. Contact $K_5$ is disposed to electrically contact the roller surface 76 by way of arm 88 when the solenoid 42 is de-energized. The roller surface thereby comprises a switch arm engaging the contact $K_5$ and the cam surface 70 near both extremities of motion to afford in addition to improved tuning efficiency and precision the automatic switching operation of the indexing mechanism by the relay system hereinbefore described. The contacting action of $K_3$ to $K_4$ and of $K_3$ to $K_5$ could of course be provided by separate switches suitably operated by solenoid arm 88 or pawl arm 74 and thus provide greater freedom of adjustment of the part of the stroke at which the contacts are made.

There is therefore provided by the invention a remote control tuning system for television receivers effecting improved precise automatic tuning control by a precisely operated solenoid actuated indexing mechanism in combination with an improved solenoid control circuit. In further accordance with the invention tuning control is effected without interference to signal circuits by direct current actuating controls.

What is claimed is:

1. A remote control system for automatically tuning a television receiver including a rotatable tuner from a remote unit comprising in combination, a current operated indexing mechanism including an operating solenoid and movable core element, a direct-current control circuit including a capacitor having a discharge circuit connected for causing energization of said solenoid, and remote means in said unit for selectively discharging said capacitor.

2. A remote control system as defined in claim 1, wherein the tuner is of the sequential type, and wherein the indexing mechanism includes means for returning the movable core element to a retracted position of rest from which it moves in response to said energization, means providing a cam surface rotatable with said tuner having a plurality of equidistantly spaced detent notches for determining a sequential series of tuning positions, a linkage connected with and actuated by said movable core element having a pawl arm and a roller surface both adapted to contact said detent notches to effect rotation of said tuner, means in said linkage for moving said pawl arm into engagement with one of the detent notches providing for partial rotation of said tuner from one sequential tuning position to the next during a first portion of the movement of said core element from its retracted position, and means in said linkage operative to continue and complete the rotation of said tuner to the next one of said sequential tuning positions by engagement of said roller surface with another one of said detent notches during the remaining portion of the movement of said core element from said retracted position.

3. A system as defined in claim 2 wherein said pawl arm is a nonconductor of electrical current, said roller and said cam surfaces are electrical conductors including an electrical contact so disposed that it electrically engages said roller surface when said solenoid is de-energized, said roller surface thereby comprising a switch arm engaging said contact and said cam surface near opposite extremities of motion thereof, and wherein there is provided a relay operable to condition said solenoid for energization upon engagement of said contact with said roller and to de-energize said solenoid upon engagement of said roller with said cam surface.

4. A system as defined in claim 3 wherein means are provided for charging the capacitor upon engagement of said contact and said roller, a circuit connecting the relay in series with the discharging path of said capacitor to actuate said relay with discharging current therefrom to initially energize said solenoid, and a circuit for abruptly discharging said capacitor upon engagement of said roller and said cam surface to return said solenoid to de-energized position.

5. A remote control system for automatically tuning a television receiver including a rotatable tuner from a remote unit comprising in combination, a solenoid actuated indexing mechanism connected to said tuner, a direct current control circuit including a capacitor having a discharge circuit connected for causing energization of said solenoid, and means in said unit for selectively effecting discharge of said capacitor.

6. A system as defined in claim 5 wherein said indexing means includes a solenoid actuated linkage having two indexing members and a detent disc having a plurality of detents therein, said linkage providing upon energization of said solenoid tuning motion of one indexing member upon a given detent over a portion of the tuning cycle and tuning motion of another indexing member upon a further successive portion of the tuning cycle upon a different detent.

7. A solenoid control circuit for remote tuning apparatus comprising in combination an indexing mechanism, a solenoid for actuating said indexing mechanism throughout a tuning cycle, a capacitor, a direct current source connected for charging said capacitor, a discharge circuit having a discharge path including actuating means for said solenoid, remote means for selectively discharging said capacitor to actuate said solenoid, and means for automatically charging said capacitor upon completion of the indexing cycle.

8. A circuit as defined in claim 7 having a second capacitor, a direct current source connected to intermittently charge said second capacitor, a discharge path for said second capacitor, said discharge path including said first capacitor and said actuating means for said solenoid, switching means, and connections on said switching means for automatically discharging said second capacitor through said actuating means for said solenoid to effect indexing through a tuning cycle when unused tuning channels are selected by said mechanism.

9. A circuit as defined in claim 7 having a second capacitor, a direct current source connected to intermittently charge said second capacitor, a discharge path for said capacitor, switching means actuated by said solenoid for connecting said second capacitor at the de-energized position of said solenoid to said discharge path for said second capacitor, said discharge path having two branches, one branch through a portion of the solenoid actuating means, the second branch through said first capacitor and another portion of said solenoid actuating means, discharge current from said second capacitor through said first discharge path initially operating said solenoid actuating means, a second discharge current from said second capacitor through said second discharge path thereby charging said first capacitor, said first capacitor providing a third discharge current, through said first branch of said discharge path when said switching means disconnects said second capacitor from said discharge path to effect indexing through a tuning cycle when unused tuning channels are selected by said mechanism.

10. Means as defined in claim 9 including a further low resistance path and contacts connected therewith for short circuiting said first capacitor near the middle of the solenoid stroke.

11. Automatic means for remote control of indexing mechanisms comprising an actuating solenoid for controlling said indexing mechanism, a first operating circuit for said solenoid, selective means for initiating said first operating circuit, a second operating circuit for said solenoid and automatic means for initiating said second operating circuit in a predetermined sequence comprising switch means actuated by operation of the indexing means.

12. A control circuit for a remote tuning control system comprising in combination, a solenoid for actuating an indexing mechanism, a circuit including a series switch and power supply terminals connected for energizing said solenoid, relay means for operating said series switch and holding the relay in energized position, terminals for connecting a direct current source, a capacitor connected in series with said last mentioned terminals and said relay means, a diode connected in parallel with said relay means with such polarity that said capacitor will charge from said direct current source without actuating the relay means, a selector switch, a selective discharge circuit for said capacitor including switch contacts on said selector switch and said relay means, and contact means actuated by said solenoid for releasing the relay from energizing position.

13. A circuit as defined by claim 10 including a further capacitor and series automatic switch means connected in shunt with said capacitor, mechanical means actuating said automatic switch means with said solenoid, and connections upon said switch means for automatically connecting said further capacitor in said discharge circuit in unused indexing positions.

14. A circuit as defined by claim 13 wherein the indexing mechanism comprises a detent disc, a linkage actuated by said solenoid having pawl arm contacting said disc during a first portion of solenoid actuation to move said indexing mechanism thereby and having a roller contacting said disc during the last portion of solenoid actuation to precisely move said indexing position to a predetermined fixed position.

References Cited in the file of this patent

UNITED STATES PATENTS

| Number | Name | Date |
|---|---|---|
| 1,245,371 | Noyes | Nov. 6, 1917 |
| 1,565,336 | Seafert | Dec. 15, 1925 |
| 2,362,690 | Fichter et al. | Nov. 14, 1944 |
| 2,384,114 | Moore | Sept. 4, 1945 |
| 2,402,933 | Williams | June 25, 1946 |
| 2,473,907 | Ridgely, Jr., et al. | June 21, 1949 |